United States Patent [19]
Friedman

[11] Patent Number: 4,887,147
[45] Date of Patent: Dec. 12, 1989

[54] THERMAL PACKAGE FOR ELECTRONIC COMPONENTS

[75] Inventor: Harvey S. Friedman, Sudbury, Mass.

[73] Assignee: Digital Equipment Corporation, Maynard, Mass.

[21] Appl. No.: 69,406

[22] Filed: Jul. 1, 1987

[51] Int. Cl.$^4$ .................... H01L 23/02; H01L 23/16
[52] U.S. Cl. ..................................... 357/74; 357/75; 357/81
[58] Field of Search .......................... 357/74, 75, 81

[56] References Cited

U.S. PATENT DOCUMENTS

| | | | |
|---|---|---|---|
| 3,769,560 | 10/1973 | Miyake et al. | 357/74 |
| 4,396,935 | 8/1983 | Schuck | 357/81 |
| 4,479,140 | 10/1984 | Horvath | 357/81 |
| 4,620,215 | 10/1986 | Lee | 357/81 |
| 4,647,959 | 3/1987 | Smith | 357/81 |
| 4,688,074 | 8/1987 | Iinuma | 357/74 |
| 4,688,077 | 8/1987 | Wakabayashi et al. | 357/81 |

Primary Examiner—Andrew J. James
Assistant Examiner—Gregory A. Key
Attorney, Agent, or Firm—Nutter, McClennen & Fish

[57] ABSTRACT

A thermal package for electronic components, such as semiconducting chips, is disclosed. Each chip is connected to a printed circuit interconnect substrate by flexible Tape Automated Bonding leads, and a pliant foam pad is attached to the surface of each chip adjacent the printed circuit interconnect substrate. A heat spreader is attached to the major surface of each chip above the printed circuit interconnect substrate. The heat exchangers are mounted to a support plate that is disposed above the printed circuit interconnect substrate. An external heat exchanger is attached to the exposed major surface of the support plate. The heat spreaders are secured to the support plate so they are urged upwards against the external heat sink. Heat generated by the chips is conducted through the heat spreaders to the external heat sink. Conductors on the support plate and the heat sink are used to provide a voltage to the chips.

17 Claims, 3 Drawing Sheets

THERMAL PACKAGE FOR ELECTRONIC COMPONENTS

FIELD OF THE INVENTION

This invention relates generally to the field of packaging for electronic components such as semiconductor chips and, more particularly, to packaging which serves as a sink for heat generated by the chips.

BACKGROUND OF THE INVENTION

Recent advances in semiconductor manufacturing technology have resulted in the increased miniaturization of integrated semiconductor components, generally known as "chips". The new chips are able to perform more complex functions, and at a faster rate, than their predecessors, yet are often the same size, or smaller. In order to perform these complex functions, the new chips consume more power than their predecessors and, as a consequence, generate more heat. This is significant because most chips should be operated below 100° C. If a chip becomes too hot, the semiconductor junctions, which constitute the basic electrical elements within the chip, have a tendency to break down and the chip may malfunction., Thus, it is necessary to efficiently extract the heat, or otherwise cool the chips, while they are operating to insure that they continue to function properly.

Thermal packages have been provided for chips which, in addition to providing chips with protection, include a means for extracting the heat generated by the chips. Inside the chamber is some type of heat transfer device, such as pistons or other members formed of thermally conductive material, that are each in contact with a seperate chip and are all in contact with an external heat sink. The external heat sink usually comprises either a set of cooling fins that are integral with the outer surface of the package, or a cold plate with liquid circulating therethrough. The heat generated by the chips is extracted by the heat sink through the heat transfer devices.

In order for heat to readily flow from the chip through the heat transfer device, there should be a minimal amount of thermal resistance between the chip and the heat transfer device Consequently, the heat transfer device must be in physical contact with the chip. Many thermal packages are provided with heat transfer devices that are biased against the adjacent chips by springs or other mechanical devices. These devices thus exert a stress-inducing, force on the chip. This stress may be aggravated due to the repetitive thermal expansion and contraction of the heat transfer device as the quantity of heat passing through it varies, causing the heat transfer devices to expand and contract at a rates different than those of the chips they are in contact with. Moreover, the heat transfer devices may further stress the chips they are in contact with by imparting external strains and transmitting mechanical vibrations. These stresses may occur both in during the normal operation of the device or as a consequence of movement of the device such as in shipping or instillation. Over time, the changes in mechanical stress may fatigue the chips so that they are torn loose from the circuit they are attached to, break, or are otherwise rendered useless.

Furthermore, the heat transfer devices should be in good physical contact with the external heat sink in order to maintain good thermal conductivity therebetween. To provide the necessary contact, many thermal packages are integral assemblies wherein the chip, the heat transfer device and the external heat sink cannot be readily disassembled from each other. This type of assembly makes it difficult to perform maintenance on just one part of the package. For instance, if a chip in the package malfunctions, it may be difficult, to gain access to it so it may be replaced, and so the entire package may have to be replaced. This situation would add to the overall cost of operating a device that contains this type of thermal package.

Moreover, many new chips need to be supplied with a relatively high drain voltage level in order to insure their efficient operation. Normally this voltage is supplied by conductors on the printed circuit board to which the chip is attached. In a thermal package, the chip may be attached to a small-sized printed circuit board within the package that may not have sufficient space to accommodate the conductors necessary to supply the drain voltage.

Another consideration in the packaging of semiconductor chips is that frequently the chips attached to a particular circuit generating the same amount heat are subjected to differing cooling conditions. This may be because of their locations in the circuit that they are part of. For instance, a chip closer to a cooling source, such as a fan or an opening, may operate at lower temperature than a chip further away. When this occurs, signal transmission between chips may be degraded because of differing voltage levels and noise margins on the chips as a result of their being operated at substantially different temperatures.

SUMMARY OF THE INVENTION

This invention provides a new and improved thermal package for semiconductor chips.

The thermal package of this invention includes one or more chips that mounted on a printed circuit interconnect substrate and that are attached thereto by flexible leads, such as Tape Automated Bonding, (TAB), leads. A pliant foam pad is attached to the surface of each chip adjacent the printed circuit interconnect substrate. A heat spreader is attached to the top of each of the chips above the printed circuit interconnect substrate. The heat spreaders are secured to a support plate that is mounted above the printed circuit interconnect substrate. A heat sink, such as a cap with cooling fins, or a cold plate, is attached to the top surface of the support plate. The heat spreader is made of a material that has good thermal conductivity characteristics and the substantially same thermal coefficient of expansion as the chips.

The heat spreaders are mounted, in bores formed in the support plate, and secured therein by a ring and clamp assembly that biases the top of the heat spreaders against the heat sink.

Electrical conductors are provided on the surface of the support plate adjacent the printed circuit interconnect substrate. The heat spreaders have conductors on their outer surfaces that provide an electrical connection between the support plate conductors and electrical bond points on the top surface of the chips.

When the thermal package is assembled, the chips therein are protected from external forces. A voltage can be supplied to the chips through the conductors in the support plate and the heat spreader. Since the chips are firmly attached to the heat spreader, and the heat spreader is urged against the external heat sink, heat generated by the chips readily flows through the heat spreader to the external heat sink.

Furthermore, each chip is provided with an individual heat spreader that efficiently conducts heat away therefrom towards the heat sink regardless of its position in the thermal package. Each heat spreader operates independently of the others, so that chip to chip temperature differences can be minimized. As a result, subsequent voltage and noise variations between the chips can similarly be reduced.

The heat spreaders do not exert any substantial stress on the chips. This is because the heat spreaders and chips are attached together and the clamp and ring assembly biases the chip-and-heat spreader sub-assembly away from the printed circuit interconnect substrate. Any movement by the chip and heat spreader sub-assembly relative to the printed circuit interconnect substrate is tolerated by the flexibility of the TAB leads.

Moreover, the individual heat spreaders will each be in physical contact with the surface of the heat sink regardless of any planarity variations of the heat sink surface.

Since the heat spreader is normally biased against the heat sink, the two do not have to be attached together with permanent fasteners in order to maintain firm physical contact, and good thermal transfer characteristics therebetween. Fasteners, such as screws, can be used to attach the heat sink to the thermal package. This makes it possible to assemble this thermal package so that it can be readily taken apart if it is necessary to perform maintenance or replace the chips therein.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF THE INVENTION

Figure 1:
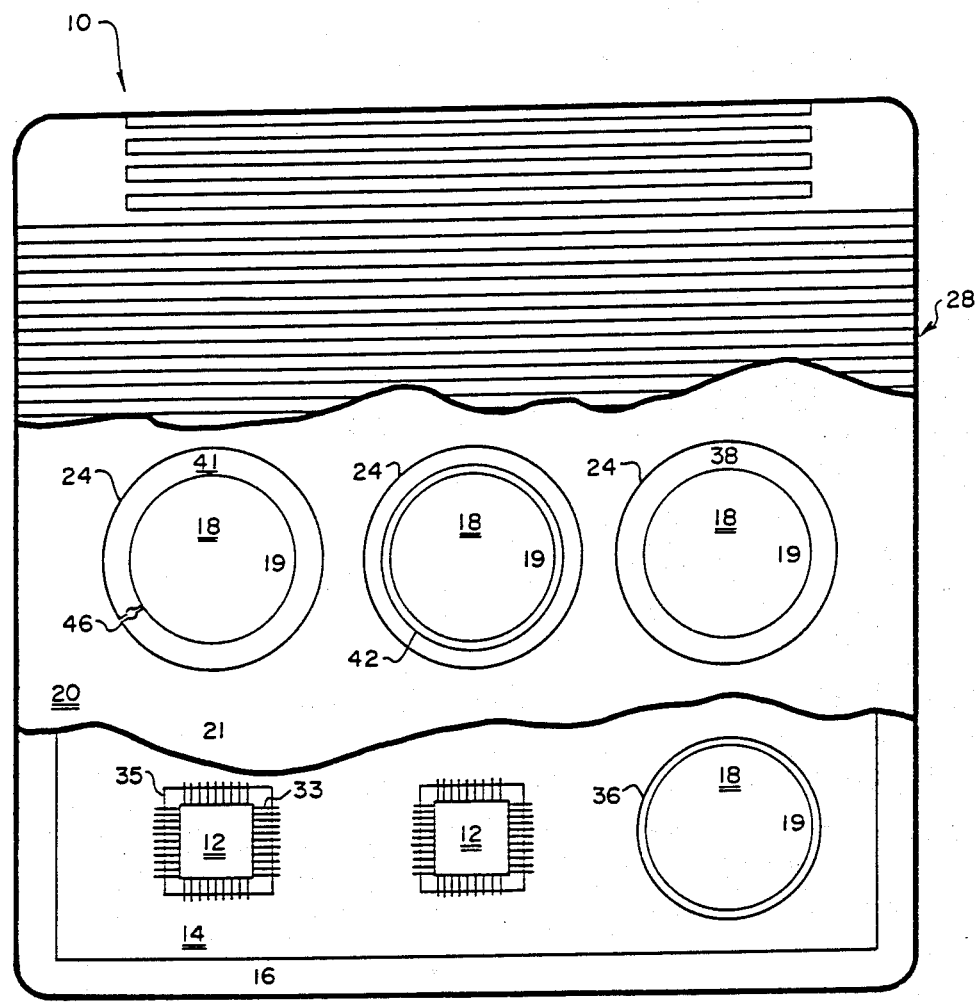
FIG. 1 is a top view, partially cut away, illustrating the thermal package of this invention.

FIG. 1 illustrates a thermal package 10 constructed in accordance with this invention which contains a number of chips 12 mounted on a printed circuit interconnect substrate 14. The printed circuit board 14 is affixed to base plate 16 which is formed of a material which matches the thermal coefficient of expansion of the printed circuit interconnect substrate 14, such as a polyimide-copper composite. Heat spreaders 18, each with a substantially cylindrical profile and a planar top surface 19, are attached to the major surfaces of the chips 12 above the printed circuit board 14. The heat spreaders 18 are secured to a support plate 20, with a planar top surface 21, that forms a number of spreader bores 24 to accommodate the individual heat spreaders 18. An external heat sink, such as a cooling fin plate 28, having a planar bottom surface 30 (FIG. 2), is attached to support plate 20 so the heat sink bottom surface 30 (FIG. 2) abuts the spreader top surfaces 19 (FIG. 2).

Figure 2:
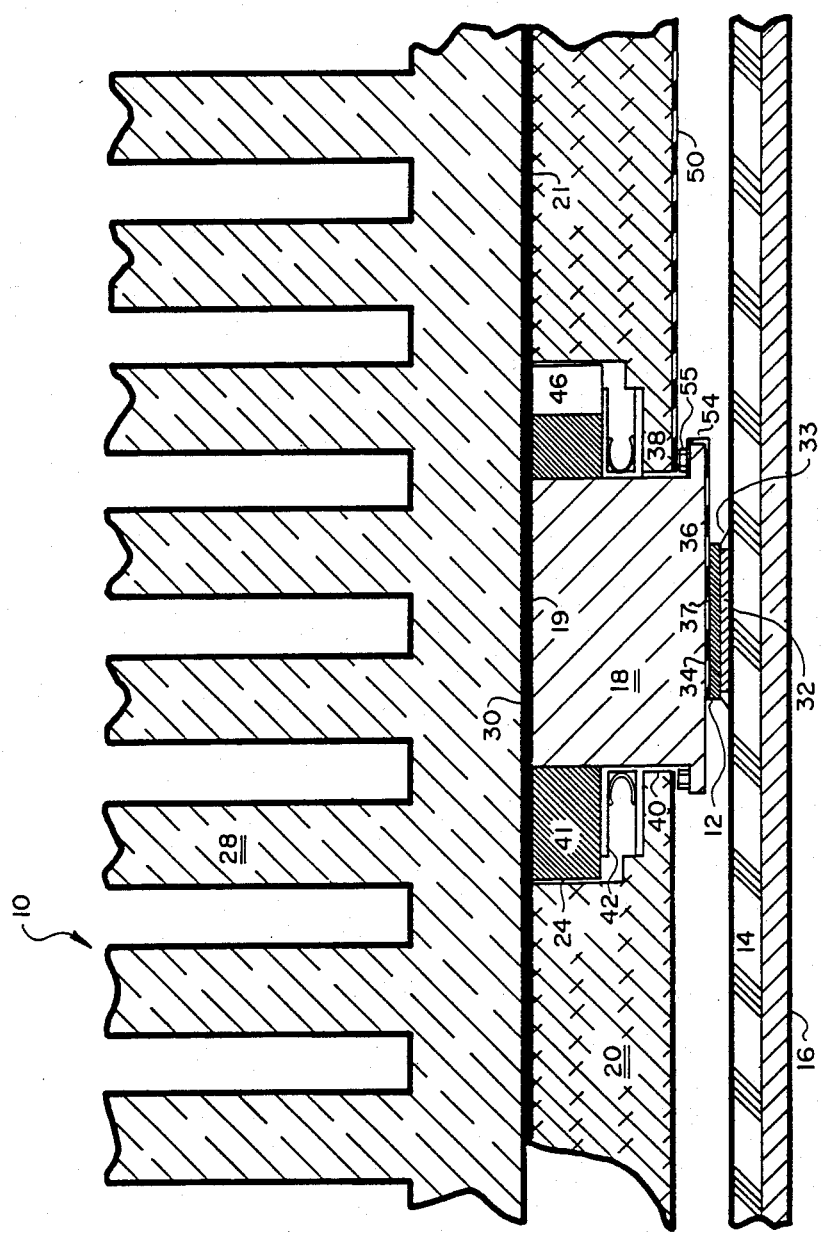
FIG. 2 is a cross-sectional view of the thermal package of this invention with a chip mounted therein.

As depicted in FIG. 2, each chip 12 is provided with a pliant foam pad 32 that is affixed to the surface of the chip 12 on which the components are formed, the active surface, which is adjacent the printed circuit interconnect substrate 14. Tape Automated Bonding, (TAB), leads 33, formed on a section of film 35, which are relatively flexible, electrically connect bond points on the chip 12 (not illustrated) to conductors on the printed circuit board 14.

Each heat spreader 18 is formed from a ceramic or other material with good thermal conductivity characteristics and the same thermal coefficient of expansion as the chip 12 it is attached to. One type of material that the heat spreaders 18 may be formed from is high thermal conductivity silicon-carbide ceramics. The heat spreader 18, has a bottom planar surface 34 that the chip 12 is bonded to. The chips 12 and heat spreaders 18 are bonded together by an adhesive 37 with good thermal conductivity characteristics, such as some epoxies or solder. The heat spreader bottom planar surface 34 is part of a heat spreader bottom section 36 that subtends a cross-sectional area greater than that subtended by the main body of the heat spreader 18.

Figure 3:
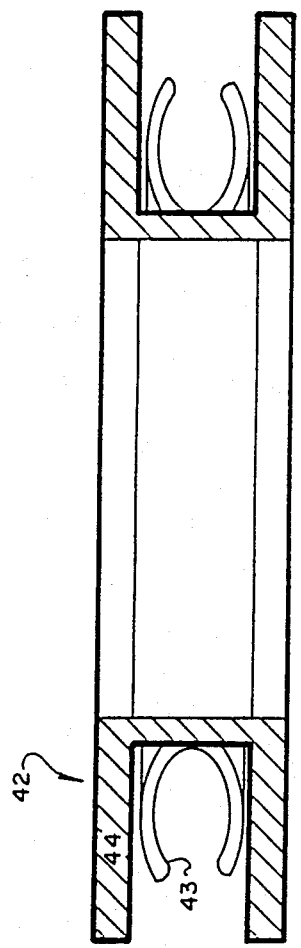
FIG. 3 is a cross-sectional illustration of a flex seal spring of FIG. 2 used to bias the heat spreader towards the external heat sink according to this invention.

The support plate 20 is formed from a material, such as a beryllium-copper alloy, that has a thermal coefficient of thermal expansion identical to that of the cooling fin plate 28 and the base plate 16. A stepped annular lip 38, integral with the support plate 20, extends into each spreader bore 24 adjacent the printed circuit board 12. The annular lip 38 defines a bottom opening 40 with a cross-sectional area less than that of the spreader bottom section 36. The chip 12 and heat spreader 18 subassembly are secured to the support plate 20 by a clamp 41 and flex spring 42. The flex spring, shown more detail in FIG. 3, has a coiled spring 43 encased within a rubber ring 44. The flex spring is disposed around the heat spreader 18 above the annular lip 38 of the support plate 20. The clamp 41 is a split-ring with a threaded space 46 used to accommodate an insertion tool. The clamp 41 is secured to the outer circumference of the heat spreader 18 and disposed so the flex spring 42 is compressed between the clamp and the support plate annular lip 38. The threaded space 46 includes a cam feature to facilitate the clamping action of the clamp 41 around the heat spreader 18.

The surface of the support plate 20 proximate the printed circuit board 14 is provided with one or more conductors 50 that extend to the bottom openings 40. The conductors 50 may be insulated from the support plate 18 and each other by a polyimide film or other suitable insulator, (not illustrated). The conductors 50 are electrically connected to associated spreader conductors 54 that have been deposited, utilizing suitable metalization techniques known in the art, onto the surface of the spreader bottom sections 36, including on the planar bottom surface 34. The electrical connection between support plate conductor 50 and the spreader conductor 54 may be made using suitable compliant conductive member 55 such as electrical conductive elastomer section or metal springs. The spreader conductors 54 are maintained in electrical contact with bond points on the major surface of the chips 12 through physical contact, soldering, or an electrically conductive adhesive.

The printed circuit interconnect substrate 14 is provided with a number of external leads (not shown) for electrically connecting the chips 12 to the circuit they are to be attached to. One or more openings, not illustrated, are provided in the base plate 16 to accommodate the leads (not shown).

The thermal package 10 may be assembled by first bonding the chips 12 to the spreader bottom sections 36 and the printed circuit interconnect substrate 14 to the base plate 16. Standard TAB bonding techniques are used to connect the chips 12 to the printed circuit interconnect substrate 14. The heat spreaders 18 are attached to the top of the chips 12. The support plate 20 is then located over the heat spreaders 18, and the clamps 41 and flex springs 42 are inserted over the heat spreaders 18 to secure them to the support plate 20. The cooling fin 28, or other heat sink, may then be attached to the support plate top major surface 21.

Alternatively, the thermal package 10 may be assembled by first TAB bonding the chips 12 to the printed circuit interconnect substrate 14. The heat spreaders 18 are then mounted to the support plate 20 with the clamp 41 and flex spring 42 subassembly. The heat spreaders 18 and support plate 20 subassembly is then gang bonded to the chips 12.

When this thermal package 10 is assembled, the chips 12 and printed circuit interconnect substrate 14 are protected from external forces by the base plate 16, the support plate 20 and the cooling fin plate 28. A voltage may be supplied to the chips 12 through the plate conductors 50 and the spreader conductors 54. The heat spreaders 18 serve as heat transfer devices and heat generated by the chips 12 readily passes through them to the cooling fin plate 28.

The flex springs 42 urge the clamps 41 and heat spreaders 18 attached thereto away from the support plate bottom openings 40 so that the heat spreader top surfaces 21 are biased against the heat sink bottom surface 30. Since the chips 12 are attached to the spreader bottom planar surfaces 34 and the heat spreaders are biased away from the printed circuit interconnect substrate 14, the heat spreaders 18 do not exert any force on the chips 12. Also, the chips 12 and heat spreaders 18 have the same coefficient of thermal expansion, so contraction or expansion of the chips 12 and heat spreaders 18 caused by changes in the heat flux therethrough will be identical. Therefore, the stress on the chips 12 caused by the contact of the heat spreaders 18 against them is minimal. Since a foam pad 32 is attached to each of the chips 12, and the chips 12 are connected to the printed circuit interconnect substrate 14 by the flexible TAB leads 33, vertical and horizontal movement relative to the printed circuit interconnect substrate 14 during installation, and due to thermal expansion and contraction, is tolerated. Thus, the chips 12 housed in the thermal package 10 are subject to virtually no mechanical stress that over time can cause the chips to become fatigued and rendered useless.

Also, each chip 12 housed in this package 10 is attached to a separate heat spreader 18 that serves as a path for the efficient condusction of heat away therefrom regardless of its position in the package 10 so the temperature differences between the chips 12 will be minimized. As a result, subsequent voltage and noise variations between the chips, that are the result of temperature variations are similarly reduced.

Furthermore, when the thermal package 10 is assembled by first installing the chips 12 on the printed circuit interconnect substrate 14 and then mounting the heat spreaders 18 and support plate 20 subassembly to that subassembly, the heat spreaders 18 may be precisely positioned with respect to the support plate 20. This makes providing the electrical connection between the support plate conductors 50 and the spreader conductors 54 a relatively simple task. Also, this assembly process allows the use of standardized components and can be readily performed by automated assembly equipment resulting in economies cost of both components and assembly.

Moreover, since the printed circuit interconnect substrate 14, the base plate 16, and the support plate 20 have substantially identical coefficients of thermal expansion, these components will not stress each other as the heat generated by the chips 12 changes.

Another advantage of this thermal package 10 is that the action of the clamps 41 and flex springs 42 biasing the heat spreaders 18 against the heat sink bottom planar surface insures there is good mechanical contact, and hence thermal conductivity between the heat spreaders 18 and the cooling fin plate 28. Since the heat spreaders 18 are normally biased against the cooling fin plate 28, the package can be assembled with fasteners, such as screws, that allow for the quick disassembly of the package 10. This makes repair and replacement of the portion of the thermal package 10 containing the chips 12 a relatively simple task. This is especially important if the thermal package 10 has a cold plate with recirculating coolant instead of a cooling fin plate 28 as a heat sink; the package 10 can be disassembled for repair without disconnecting the cold plate from its associated piping. Moreover, since the cooling fin plate 28, or other heat sink is not rigidly attached to the package 10, it will not stress the package 10 as the heat generated by the chips 12 fluctuates.

Furthermore, the clamps 41 compress the flex spring's rubber rings 44 (FIG. 2) against the outer circumference of the heat spreaders 18 and the walls defining the spreader bores 24. The flex spring 42 thus also serves as a seal to keep contaminates away from the chips 12 and printed circuit interconnect substrate 14. Moreover, the foam pad 32, adjacent the active surface of the chip 12 seals the components fabricated thereon so as to prevent their degradation due contact with environmental contaminants.

A still further advantage of this package 10 is that it provides electronic shielding for the chips 12 housed therein. The base plate 16, the port plate 20 and the cooling fin plate 28 are formed of metal that blocks the transmission of radio waves to or from the chips 12. Thus, this package 10 prevents external electronic emissions from affecting the operations of chips 12 therein and similarly prevents any high frequencey electronic waves generated by the chips as consequence of their operation from radiating beyond the package and possibly affecting adjacent electronic components.

It is understood that this description is for the purposes of illustration only, and alternative embodiments of this invention are possible. For instance, as previously mentioned, a cold plate rather than the cooling fin plate 28 can be used as the external heat sink. The operation of the thermal package 10 is independent of the type of printed circuit interconnect substrate provided. The thermal package may be used to house and extract heat from a single chip as well as multiple chips. In some embodiments of the invention it may be desirable for reasons of design efficiency and economy to attach more than one chip to each heat spreader. Alternative methods of securing the heat spreaders 18 to the support plate so they are urged against the heat sink may be used. Also, the thermal package 10 may have more than one plate conductor 50 and spreader conductor 54 per chip 12 in order to supply multiple voltages thereto. Therefore, it is the object of the appended claims to cover all such variations and modifications as come within the true spirit and scope of the invention.

What is claimed as new and desired to be secured by Letters Patent of the United States is:

1. An assembly for housing at least one electronic component, said assembly comprising:
    a. a printed circuit interconnect substrate which the component is electrically connected thereto;
    b. a heat spreader having a bottom surface wherein the electronic component is bonded thereto so as to form a component-and-spreader subassembly, said heat spreader having a spreader top major surface;
    c. a support plate spaced away from said printed circuit interconnect substrate, with an exposed major surface, said support plate defining a spreader bore for said heat spreader, said heat spreader disposed in said spreader bore, said support plate dimensioned so that said spreader top major surface protrudes above said support plate exposed major surface;
    d. a heat sink attached to said support plate, said heat sink having a major surface adjacent said support plate major surface; and
    e. a spring fastening means to secure said component-and-spreader subassembly to said support plate and to urge said spreader top major surface against said heat sink major surface.

2. The assembly of claim 1 wherein the electronic component is electrically connected to said printed circuit interconnect substrate by a plurality of flexible metal leads.

3. The assembly of claim 1 wherein a pliant foam pad is disposed between the electrical component and said printed circuit interconnect substrate.

4. The assembly of claim 1 wherein:
    a. said heat spreader has a substantially cylindrical profile and said spreader bore is defined by a substantially cylindrical perimeter;
    b. an annular lip extends from said support plate into each said spreader bore, so as to define an opening;
    c. said heat spreader including a bottom section adjacent said printed circuit interconnect substrate with a cross-sectional area greater than that of opening defined by the annular lip; and
    d. a resilient member is disposed around said heat spreader in said spreader bore adjacent said annular lip and a clamp is secured to said heat spreader and disposed over said resilient member so said resilient member urges said clamp and said heat spreader towards said heat sink.

5. The assembly of claim 1 wherein:
    a conductor is provided on said heat spreader, said conductor is in contact with the electrical component attached thereto; and
    a conductor is provided on said support plate, said conductor electrically connected to said heat spreader conductor so as to define an electrical path from said support plate to said electrical component.

6. The assembly of claim 5 wherein said support plate conductor is at least partially, disposed on the surface of said support plate.

7. The assembly of claim 1 wherein the electronic component is mounted above the surface of said printed circuit interconnect substrate.

8. The assembly of claim 1 further including a base plate attached to said printed circuit interconnect substrate opposite the printed circuit interconnect substrate surface the electrical component is attached thereto.

9. The assembly of claim 1 wherein said heat spreader has substantially the same thermal coefficient of expansion as the electronic component.

10. An assembly for housing at least one electronic component, said assembly comprising:
    a. a printed circuit interconnect substrate which the components are electrically connected thereto;
    b. at least one heat spreader having a bottom surface wherein at least one of he electronic components is bonded thereto so as to form a component-and-spreader subassembly, each of said heat spreaders having a substantially cylindrical profile, a bottom section adjacent said printed circuit interconnect substrate forming said bottom surface, said bottom section having a selected cross-sectional area, and a spreader top major surface;
    c. a support plate spaced away from said printed circuit interconnect substrate, with an exposed major surface, said support plate defining a substantially cylindrical spreader bore for each of said heat spreaders, said support plate dimensioned so that said spreader top major surfaces protrude above said support plate exposed major surface, said support plate including an annular lip extending into each spreader bore, so as to define an opening having a cross-sectional area less than that of said heat spreader bottom sections, said heat spreaders disposed in said spreader openings such that said heat spreader bottom sections are positioned below said annular lip; and
    d. a heat sink attached to said support plate, said heat sink having a major surface adjacent said support plate major surface;
    e. a resilient member disposed around each said heat spreader in said spreader bore adjacent said annular lip;
    f. a clamp secured to each said heat spreader and disposed over said resilient member so that said resilient member urges said clamp and said component-and-spreader subassemblies towards said heat sink, whereby said spreader top major surfaces are urged against said heat sink major surface.

11. The assembly of claim 10 wherein said electronic components are electrically connected to said printed circuit interconnect substrate by a plurality of flexible metal leads.

12. The assembly of claim 10 wherein a pliant foam pad is disposed between at least one of the electrical components and said printed circuit interconnect substrate.

13. The assembly of claim 10 wherein:
    a. a conductor is provided on at least one of said heat spreaders, said conductor is in contact with the electrical component attached thereto; and
    b. a conductor is provided on said support, said conductor electrically connected to said heat spreader conductor so as to define an electrical path from said support plate to said electrical component.

14. The assembly of claim 13 wherein said support plate conductor is at least partially disposed on the surface of said support plate.

15. The assembly of claim 10 wherein said electronic components are mounted above the surface of said printed circuit interconnect substrate.

16. The assembly of claim 10 further including a base plate attached to said printed circuit interconnect substrate opposite the printed circuit interconnect substrate surface the electrical components are attached thereto.

17. The assembly of claim 10 wherein said heat spreaders have substantially the same thermal coefficient of expansion as the electronic components.

* * * * *